(12) United States Patent
Farwell

(10) Patent No.: US 7,795,927 B2
(45) Date of Patent: Sep. 14, 2010

(54) DIGITAL CIRCUITS WITH ADAPTIVE RESISTANCE TO SINGLE EVENT UPSET

(75) Inventor: William D. Farwell, Thousand Oaks, CA (US)

(73) Assignee: Raytheon Company, Waltham, MA (US)

( * ) Notice: Subject to any disclaimer, the term of this patent is extended or adjusted under 35 U.S.C. 154(b) by 165 days.

(21) Appl. No.: 11/893,760

(22) Filed: Aug. 17, 2007

(65) Prior Publication Data

US 2009/0045834 A1 Feb. 19, 2009

(51) Int. Cl.
H03K 9/02 (2006.01)
(52) U.S. Cl. .......................... 327/34; 327/218; 327/263
(58) Field of Classification Search .................. 327/34, 327/218, 263
See application file for complete search history.

(56) References Cited

U.S. PATENT DOCUMENTS

| 4,853,654 | A | * | 8/1989 | Sakurai | 331/57 |
| 5,760,612 | A | | 6/1998 | Ramirez | |
| 6,992,534 | B2 | * | 1/2006 | Lin | 331/176 |
| 7,330,054 | B1 | * | 2/2008 | Masleid | 326/121 |
| 2007/0296477 | A1 | * | 12/2007 | White | 327/175 |

OTHER PUBLICATIONS

D.G. Mavis, "Single Event Transient Phenomena—Challenges and Solutions", Microelectronics Reliability and Qualification Workshop, Defense Threat Reduction Agency, Dec. 2002.
P. Eaton et al., SET Pulsewidth Measurements Using a Variable Temporal Latch:, IEEE Trans. on Nuclear Science, Dec. 2004.

* cited by examiner

Primary Examiner—Lincoln Donovan
Assistant Examiner—Ryan C Jager
(74) Attorney, Agent, or Firm—Christie, Parker & Hale, LLP

(57) ABSTRACT

A digital circuit with adaptive resistance to single event upset. A novel transient filter is placed within the feedback loop of each latch in the digital circuit to reject pulses having a width less than T, where T is the longest anticipated duration of transients. The transient filter includes a first logic element having a controllable inertial delay and a second logic element coupled to an output of the first logic element. A first controller provides a control voltage VcR to each first logic element to control a rise time of the first logic element to be equal to T. A second controller provides a control voltage VcF to each first logic element to control a fall time of the first logic element to be equal to T.

18 Claims, 12 Drawing Sheets

DIGITAL CIRCUITS WITH ADAPTIVE RESISTANCE TO SINGLE EVENT UPSET

BACKGROUND OF THE INVENTION

1. Field of the Invention

The present invention relates to electrical and electronic circuits and systems. More specifically, the present invention relates to systems and methods for improving single event upset performance of digital circuits.

2. Description of the Related Art

Particulate radiation (such as energetic electrons, protons, or ions) in space and airborne environments can cause errors (upsets) to occur in digital circuits. The response to an energetic particle is a transient pulse disturbing the voltage of one or more nodes. This may cause a logic level to change state to an opposite value for a time t. The duration t is technology dependent; for a given technology and particle energy spectrum, there is a distribution of t. If the duration t is greater than a threshold value, subsequent logic in the circuit will be responsive to it, causing errors.

If the perturbation occurs on a node within a storage element (or on its clock), its value could be switched. This is a storage element single event upset (SEU). If the perturbation occurs in combinational logic, it is a single event transient (SET). If the SET propagates to a storage element and appears at the time of sampling, than an SEU also occurs. The probability of this occurring is dependent on the clock frequency. If the SET is not captured by a storage element, then it disappears with no effect.

Upset is an increasing problem in space (and even critical terrestrial) applications, since evolving digital technologies are of ever-smaller features sizes and smaller feature-sized technology is more susceptible to upset by radiation. In order to use these technologies, methods must be provided to mitigate upset.

Conventional solutions use changes in the semiconductor process and/or internal circuit design to provide upset resistance. One standard approach is to design cells such that the transient pulse amplitude and/or, response are reduced. This, however, results in a larger cell size that can decrease the logic density by a factor of two to four. In addition, the logic may become slower by a factor of two or more. An alternate approach involves design modification of the storage elements by using techniques to filter transients in the internal holding loop of the latch (the core of a storage element). This approach, however, increases the size of the latch by a factor of two to three. It is also difficult to control the delays used in this system, resulting in the use of delays that are two to three times greater than the amount required by the system design.

In addition to reduced system performance (larger size, slower speed), prior approaches are also typically fixed and immutable, once designed. Since systems are usually designed to accommodate the worst-case process variations and the worst-case radiation environment, they typically carry a performance penalty that is greater than necessary.

Hence, a need exists in the art for an improved system or method for making digital circuits resistant to single event upset that offers reduced circuit size, improved performance, and greater flexibility than prior approaches.

SUMMARY OF THE INVENTION

The need in the art is addressed by the digital circuit with adaptive resistance to single event upset of the present invention. A novel transient filter is placed within the feedback loop of each latch in the digital circuit to reject pulses having a width less than T, where T is the longest anticipated duration of transients. The transient filter includes a first logic element having a controllable inertial delay inverter and the second logic element coupled to an output of the first logic element. In an illustrative embodiment, the first logic element is a controllable inertial delay inverter and the second logic element is an inverter. A first controller provides a control voltage VcR to each first logic element to control a rise time of the first logic element to be equal to T. A second controller provides a control voltage VcF to each first logic element to control a fall time of the first logic element to be equal to T. In an illustrative embodiment, the first and second controllers use delay locked loops to precisely control the rise and fall times of the first logic element regardless of variations in process or operating conditions.

DESCRIPTION OF THE INVENTION

Illustrative embodiments and exemplary applications will now be described with reference to the accompanying drawings to disclose the advantages teachings of the present invention.

While the present invention is described herein with reference to illustrative embodiments for particular applications, it should be understood that the invention is not limited thereto. Those having ordinary skill in the art and access to the teachings provided herein will recognize additional modifications, applications, and embodiments within the scope thereof and additional fields in which the present invention would be of significant utility.

The latch is typically the core of a storage element and is used to build flip-flops, scan flip-flops, register arrays, etc., in a digital system. By replacing the latches in a digital circuit with latches resistant to SET upset in accordance with the present teachings, the entire circuit is protected against SET upsets as long as 1) each latch is adapted to reject pulses having a pulse width less than a maximum pulse width T, where T is set to a value larger than the longest anticipated duration of transients, and 2) there is sufficient setup time available to assure that SET transients arising at the input of the latch (from preceding combinational logic) appear as free standing pulses.

Figure 1:
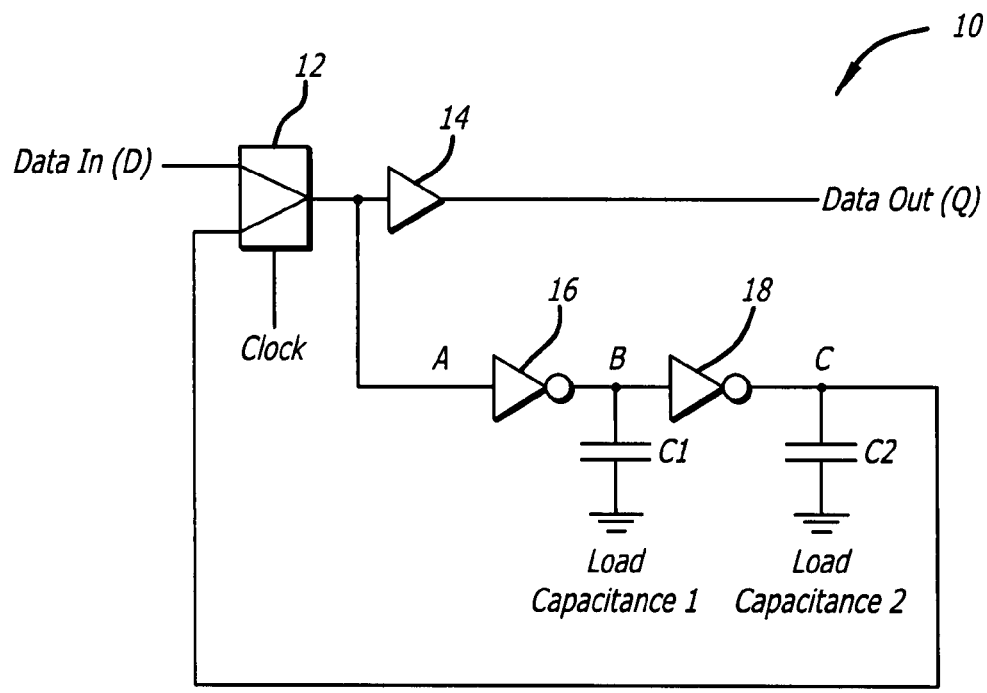
FIG. 1 is a simplified schematic of a conventional storage latch.

FIG. 1 is a simplified schematic of a conventional storage latch 10. The latch 10 includes a multiplexer 12 having a first input coupled to the input data D and an output that is fed back to a second input of the multiplexer 12 in a feedback loop. The output of the multiplexer 12 is also typically input to an output buffer 14, the output of which is the output Q of the latch 10. The output of the multiplexer 12 switches between the first and second inputs in accordance with a clock signal. When the clock is in a high position, the latch 10 is transparent and the output Q is equal to the input D. When the clock is in a low position, the latch 10 is in holding and the output is held at the value when the clock was last high.

Two inverters 16 and 18 connected in series are placed in the feedback loop to provide the necessary gain for holding. The inverters 16 and 18 are typically standard inverters that have rise and fall times determined by the drive strength of their p-channel and n-channel transistors, respectively, and the load capacitances C1 and C2, respectively, on their outputs. The time of rise or fall to a voltage equal to the threshold voltage of a subsequent logic element is defined as the inertial delay. In the conventional latch 10 of FIG. 1, any pulse whose width is less than the inertial delay $T_{id}$ of the first inverter 16 is fully suppressed. For additional information see, for example, Breuer et al., *Diagnosis and Reliable Design of Digital Systems*, Computer Science Press, Potomic, Md., 1976.

Figure 2:
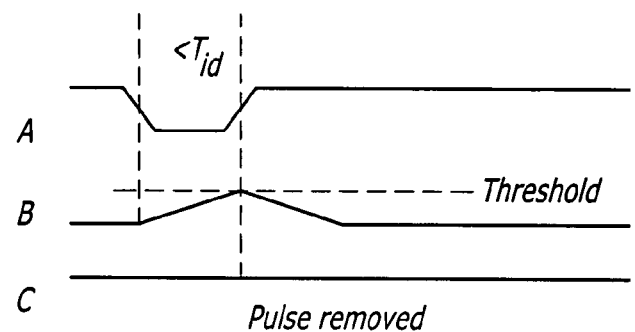
FIG. 2 is a timing diagram illustrating the theoretical operation of the conventional latch, showing the effect of the feedback loop on a pulse having a pulse width less than the inertial delay $T_{id}$ of the first inverter.

FIG. 2 is a timing diagram illustrating the theoretical operation of the conventional latch 10, showing the effect of the feedback loop on a pulse having a pulse width less than the inertial delay $T_{id}$ of the first inverter 16. The signal "A" that is input to the first inverter 16 includes a pulse having a width less than the inertial delay $T_{id}$ of the first inverter 16. After the pulse causes the input signal "A" to switch values (from high to low), the output "B" of the first inverter 16 also begins to switch (from low to high), but at a rate governed by its inertial delay $T_{id}$. At the end of the pulse, when the input signal "A" switches back (from low to high), the output "B" of the first inverter 16 has not yet crossed the logic threshold of the second inverter 18 and "B" begins to switch to its original low position. Because the pulse width is less than the inertial delay $T_{id}$, which is the rise (or fall) time to the threshold voltage of the second inverter 18, the output of the first inverter 16 never crosses the logic threshold of the second inverter 18, and the output "C" of the second inverter 18 therefore never changes from its original high position. Thus, pulses having a width less than $T_{id}$ are fully rejected by the latch 10, since the first inverter 16 needs a time $T_{id}$ to reach the threshold voltage of the second inverter 18: Pulses having a width greater than $T_{id}$ are not rejected, but are delayed by $T_{id}$.

In practice, the inertial delay of the inverter 16 is usually asymmetrical, having a rise time $T_1$ that differs from the fall time $T_2$. Only a pulse whose width is less than the faster of the rise or fall times is rejected. This is illustrated in FIGS. 3a and 3b.

Figure 3A:
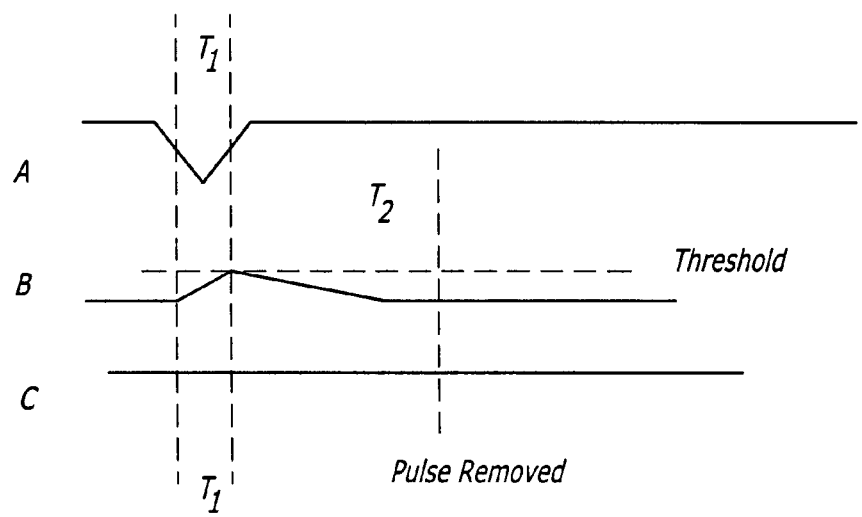
FIG. 3a is a timing diagram illustrating the actual operation of a conventional latch with a first inverter having a rise time $T_1$ that is faster (shorter) then its fall time $T_2$, showing the effect on a pulse having a width less than the rise time $T_1$.

FIG. 3a is a timing diagram illustrating the actual operation of a conventional latch 10 with a first inverter 16 having a rise time $T_1$ that is faster (shorter) then its fall time $T_2$, showing the effect on a pulse having a width less than the rise time $T_1$. As shown, a pulse whose width is less than the faster of the rise or fall times is rejected.

Figure 3B:
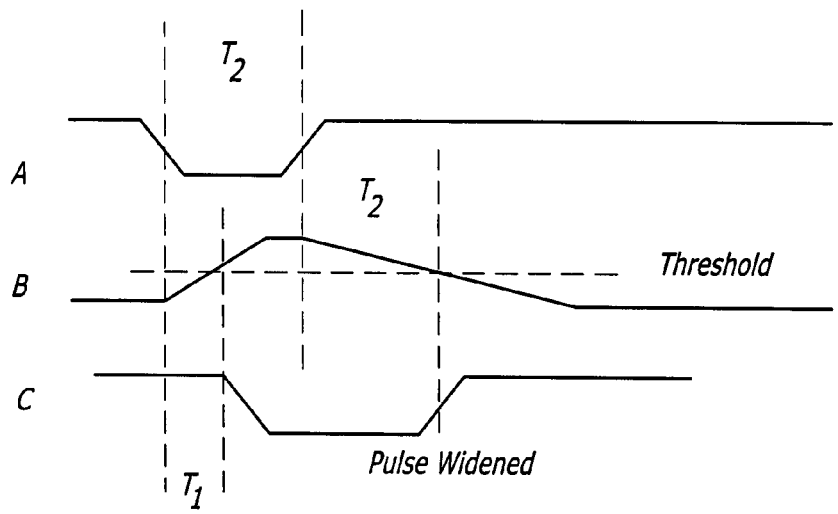
FIG. 3b is a timing diagram illustrating the actual operation of a conventional latch with a first inverter having a rise time $T_1$ that is faster then its fall time $T_2$, showing the effect on a pulse having a width less than the fall time $T_2$ but greater than the rise time $T_1$.

FIG. 3b is a timing diagram illustrating the actual operation of a conventional latch 10 with a first inverter 16 having a rise time $T_1$ that is faster then its fall time $T_2$, showing the effect on a pulse having a width less than the fall time $T_2$ but greater than the rise time $T_1$. As shown, a pulse whose width is greater than the faster of the rise or fall times is not rejected, and can even be made wider.

A storage latch or other storage element can be made resistant to upset caused by SET pulses by increasing the inertial delay of the elements in the holding loop (typically inverters), such that the inertial delay (including both the rise time and the fall time) is greater than the widest expected SET pulse. However, this approach has two shortcomings.

1) The inertial delay of an element is typically dependent on IC process variations, operating temperature, and power supply voltage. The inertial delay may therefore vary over a range of 3:1 to 4:1, due to the combination of these factors. Thus the worst case loop delay of the storage element should be 3 to 4 times that of the necessary inertial delay for SET suppression. Additionally, the SET suppression will depend on the faster of the rise or fall times. Since there is usually some asymmetry in rise/fall times, the loop delay is even slower, by the amount of difference. These effects make the storage elements much slower, and thus the logical processing system as a whole will have less throughput.

2) Once the circuit is fabricated, the inertial delay is fixed, and therefore the SET pulse width that can be suppressed is fixed, and cannot be changed.

Figure 4:
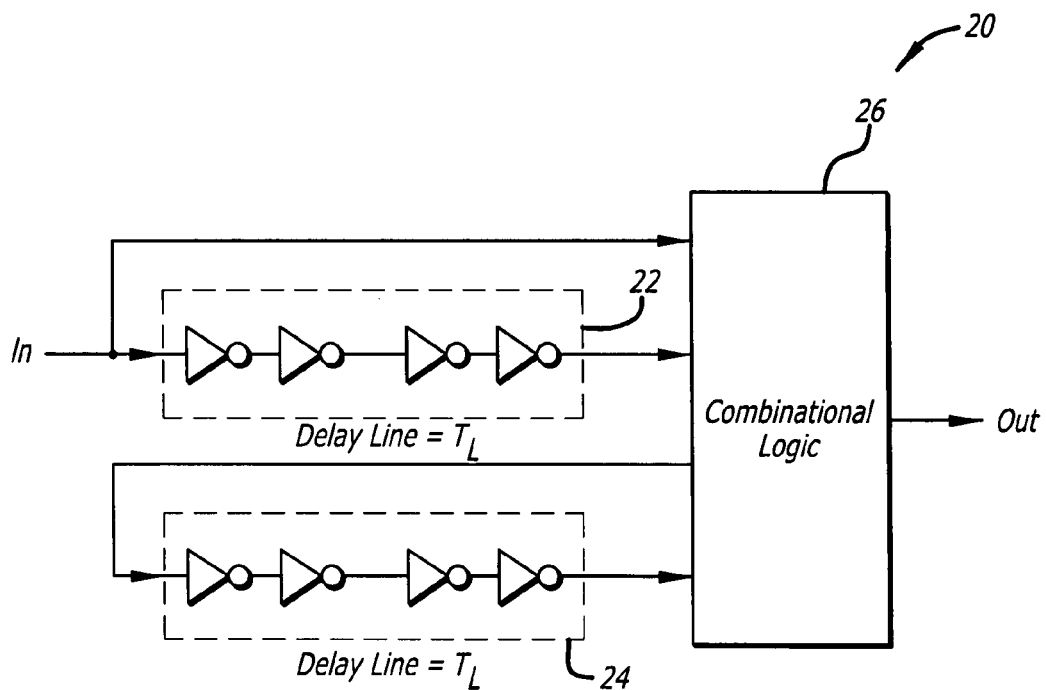
FIG. 4 is a simplified schematic of a conventional delay line based filer for rejecting SET pulses.

A conventional solution is to use delay lines and combinational logic to suppress SET pulses instead of relying on inertial delay. FIG. 4 is a simplified schematic of a conventional delay line based filter 20 for rejecting SET pulses, which would be placed in the holding loop of a conventional latch (replacing the pair of inverters shown in FIG. 1). The filter 20 includes a first delay line 22 and a second delay line 24, which is connected in series with the first delay line 22. The length $T_L$ of each delay line is made equal to the desired SET pulse width to be suppressed. The delay lines 22 and 24 are each typically made from an even number of inverters, with the advantage that the delays are the same for both rising and falling edges, overcoming the problem of asymmetry in rise and fall described above. A combinational logic circuit 26 receives the input signal, the output from the first delay line 22, and the output from the second delay line 24 and generates an output signal that rejects pulses having a width less than $T_L$. There are various implementations of the combinational logic to achieve the suppression of transients.

Specific examples of delay line suppressions and further details on their operation can be found in the following references, the teachings of which are incorporated herein by reference:

1) U.S. Pat. No. 5,760,612, entitled "Inertial Delay Circuit for Eliminating Glitches on a Signal Line" by S. R. Ramirez;

2) D. G. Mavis, "Single Event Transient Phenomena—Challenges and Solutions", 2002 Microelectronics Reliability and Qualification Workshop, Defense Threat Reduction Agency, December 2002; and 3) P. Eaton et al., "SET Pulsewidth Measurements Using a Variable Temporal Latch", *IEEE Trans. on Nuclear Science*, (December 2004).

The added delay elements and logic of a conventional delay line pulse suppression latch, however, increase the size (number of transistors) of a latch by a factor of 2 to 3 (and a digital device typically has half or more of its circuitry devoted to latches and other storage elements). It also increases the setup time, and thus the clock period, by $T_L$ plus the combinational logic delay of the filter.

Furthermore, as with the conventional inertial delay filtered latch described above, the delay line filtered latch suffers from the following two shortcomings:

1) The delay elements can be difficult to control accurately over variations in voltage, temperature, and process. The delay $T_L$ may therefore need to be three to four times greater than the amount required for SET immunity to accommodate this inaccuracy.

2) Once designed, the SET pulse width that can be suppressed is typically fixed, and cannot be changed.

The teachings of the present invention provide an improved system and method for providing SEU and SET immunity that offers reduced circuit size and greater flexibility than these conventional approaches. A novel filter is used within device storage elements to mitigate upset from both radiation events within the storage element and from single event transient events within combinational logic. The novel filter uses an inverter having a controllable inertial delay. The inertial delays are globally controlled to exact values, independent of process variations, temperature, supply voltage, or aging. The inertial delay values can be varied after fabrication to adapt to different radiation severities.

Figure 5:
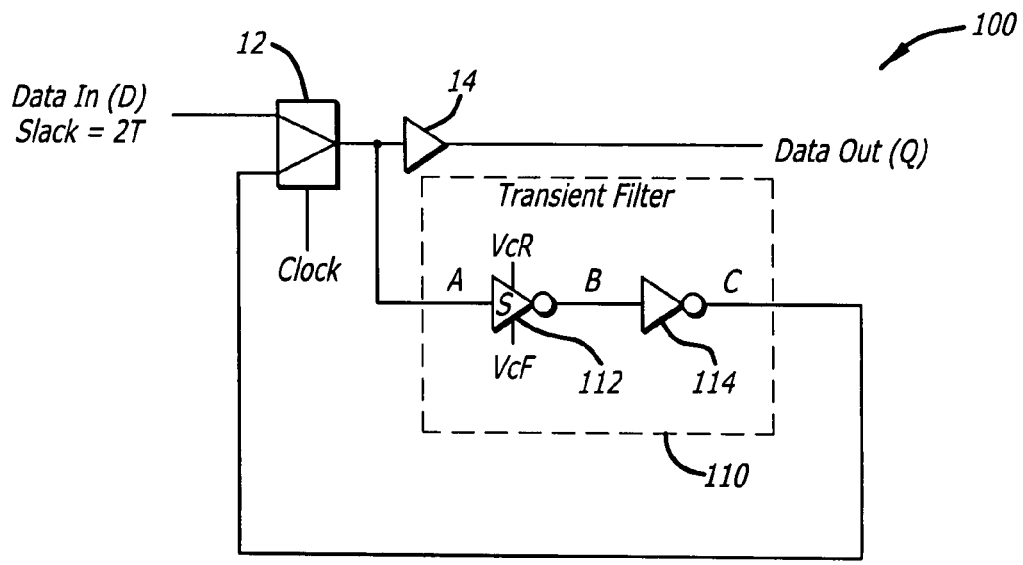
FIG. 5 is a simplified schematic of a transient-filtering latch designed in accordance with an illustrative embodiment of the present teachings.

FIG. 5 is a simplified schematic of a transient-filtering latch 100 designed in accordance with an illustrative embodiment of the present teachings. The transient-filtering latch 100 includes a multiplexer 12 having a first input coupled to the input data D and an output that is fed back to a second input of the multiplexer 12 in a feedback loop. The output of the multiplexer 12 is also input to an output buffer 14, the output of which is the output Q of the latch 100.

In accordance with the present teachings, the transient-filtering latch 100 also includes a novel transient filter 110 placed in the feedback loop of the multiplexer 12 to provide immunity from SET upsets for transient pulses having a duration less than a value T. The transient filter 110 includes a first logic element 112 having a controllable inertial delay, followed by a second logic element 114. In the illustrative embodiment, the first logic element is a controllable inertial delay inverter 112, which is adapted to receive a control voltage VcR for controlling a rise time $T_R$ of the inverter 112 and a control voltage VcF for controlling a fall time $T_F$ of the inverter 112. In the illustrative embodiment, the second logic element is a standard inverter 114. (The second logic element 114 may also be another controllable inertial delay inverter, or other logic element, without departing from the scope of the present teachings.) The rise time $T_R$ of the first inverter 112 to the logic 1 threshold of the second inverter 114 is controlled to be equal to T (the longest anticipated duration of transients), and the fall time $T_F$ of the first inverter 112 to the logic 0 threshold of the second inverter 114 is also controlled to be T. The transient filter 110 then rejects pulses having a width less than T and delays all signals by T. The data setup time is therefore increased by T.

FIGS. 6a-6d are illustrative timing diagrams illustrating the operation of a transient-filtering latch 100 designed in accordance with the present teachings. "A" shows an illustrative signal that is input to the transient filter 110 (input to the controllable inertial delay inverter 112). "B" shows the signal at the output of the controllable inertial delay inverter 112, which is input to the standard inverter 114. "C" shows the signal at the output of the standard inverter 114 (which is the output of the transient filter 110).

Figure 6A:
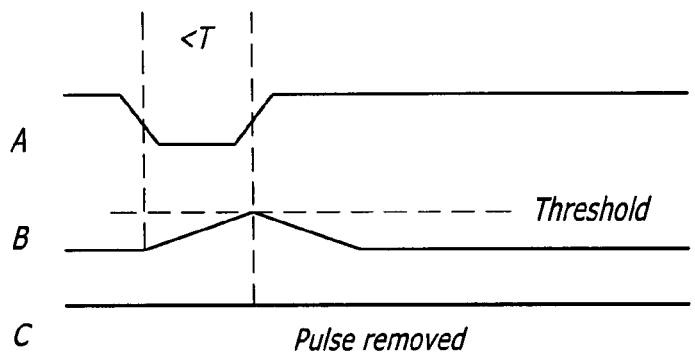
FIG. 6a is an illustrative timing-diagram illustrating the operation of a transient-filtering latch designed in accordance with the present teachings for a pulse having a width less than T.

In FIG. 6a, the input signal "A" is originally in a high position but includes a transient pule having a width less than or equal to T that causes the signal to switch to a low position for the duration of the pulse. "B" starts in a low position and "C" starts in a high position. After "A" switches to the low position, "B" begins to rise at a rate governed by the rise time ($T_R$=T) of the controllable inertial delay inverter 112. At the end of the pulse, "B" has not yet passed the logic threshold of the standard inverter 114. "B" begins to return to its original low position without ever crossing the threshold of the standard inverter 114. The output "C" of the filter 110 therefore never changes from its original high position. Thus, pulses having a width less than T are fully rejected by the transient filter 110, since the controllable inertial delay inverter 112 needs a time T to reach the threshold voltage of the second inverter 114.

Figure 6B:
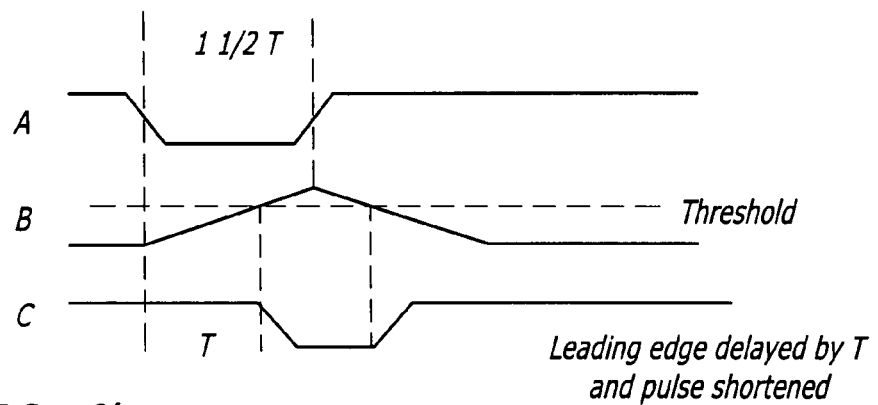
FIG. 6b is an illustrative timing diagram illustrating the operation of a transient-filtering latch designed in accordance with the present teachings for a pulse having a width of 1.5 T.

In FIG. 6b, the input signal "A" includes a pulse having a width between T and 2 T. At the beginning of the pulse, "B" begins to rise at a rate governed by the rise time ($T_R$=T) of the controllable inertial delay inverter 112. A time T after the beginning of the pulse, "B" crosses the threshold of the second inverter 114 and stays above the threshold for an amount dependent on the pulse width. The output "C" of the filter 110 therefore includes a pulse having a shortened pulse width and a leading edge delayed by T. Thus, pulses having a width between T and 2 T are not rejected by the transient filter 110, but are shortened (the reduction varies linearly from the full pulse width, at width=T, to none at all at width=2 T). Since logic typically will not respond to very narrow pulses, the effective SET rejection can extend somewhat beyond T (depending on the circuit details and the location in time that the SET occurs). Thus, the transient filtering latch 100 is partially effective in the SET region between T and 2 T.

Figure 6C:
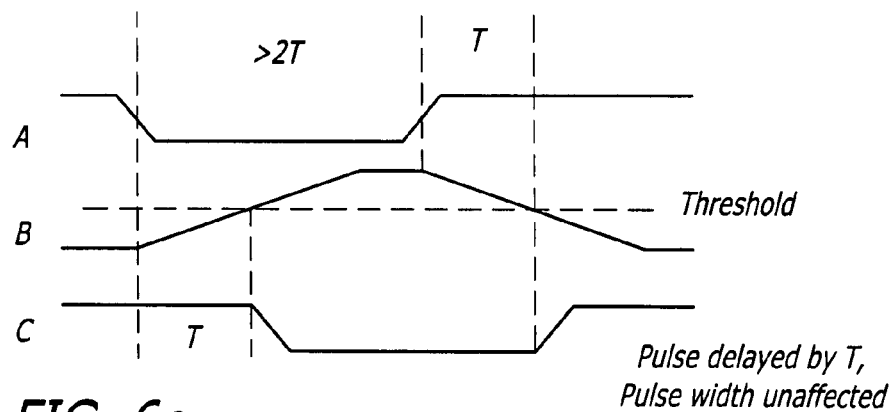
FIG. 6c is an illustrative timing diagram illustrating the operation of a transient-filtering latch designed in accordance with the present teachings for a pulse having a width a width greater than 2 T.

In FIG. 6c, the input signal "A" includes a pulse having a width greater than 2 T. At the beginning of the pulse, "B"

begins to rise at a rate governed by the rise time ($T_R=T$) of the controllable inertial delay inverter 112. A time T after the beginning of the pulse, "B" crosses the threshold of the second inverter 114 and eventually reaches its high position. At the end of the pulse, "B" begins to return to its low position: A time T after the end of the pulse, "B" crosses the threshold of the second inverter 114. The output "C" of the filter 110 therefore includes a pulse delayed by a time T. The pulse width is unaffected. Thus, the transient filter 110 has no effect (other than a delay of T) on an SET pulse having a width greater than 2 T. The transient filter 110 of the present invention may therefore also be used as a delay element, having a controllable delay equal to T.

Thus, by precisely controlling the rise and fall times of the controllable inertial delay inverter 112, free-standing pulses having a width less than T are filtered out by the transient filter 110. If the slack in the input data is set to 2 T, then any data SET will be free-standing and therefore filtered. SETs in the latch storage loop are also filtered. Clock SETs that are not near an edge cause storage loop SETs and are therefore filtered. A clock SET near an edge could cause the clock to be advanced or retarded by up to T. This reduces the effective period by T, but is accommodated by the data slack of 2 T.

Figure 6D:
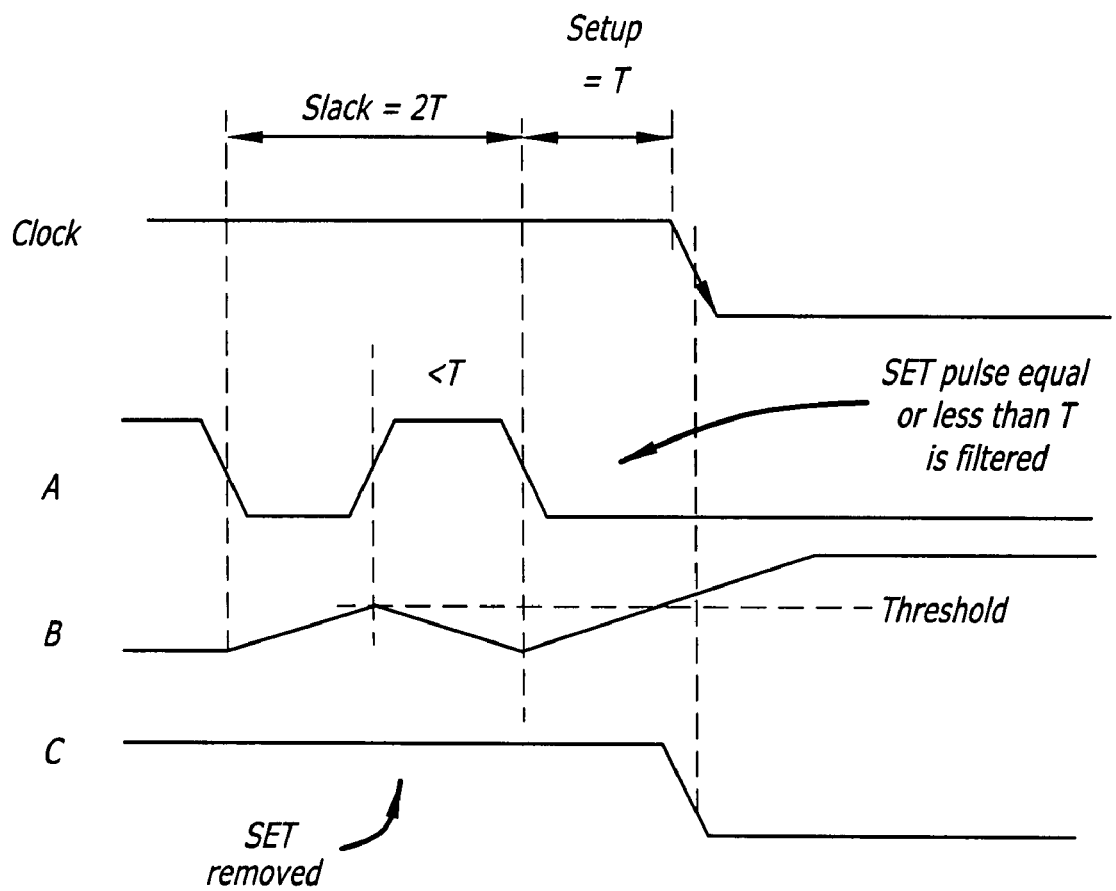
FIG. 6d is a timing diagram illustrating the operation of a transient-filtering latch designed in accordance with an illustrative embodiment of the present teachings.

FIG. 6d is a timing diagram illustrating the operation of a transient-filtering latch 100 designed in accordance with an illustrative embodiment of the present teachings for an SET pulse that occurs near a clock edge. "Clock" shows an illustrative clock signal. "A" shows an illustrative input to the transient filter 110 that includes an SET pulse with a width equal to or less than T. "B" shows the resultant output of the controllable inertial delay inverter 112, which is input to the standard inverter 114. "C" shows the resultant output of the standard inverter 114.

As shown in FIG. 6d, the input "A" to the filter 110 starts at a high level, the output "B" of the controllable inertial delay inverter 112 is therefore low, and the output "C" of the standard inverter 114 is high. When "A" switches to a low position, "B" gradually moves towards a high position, at a rate governed by the rise time ($T_R=T$) of the controllable inertial delay inverter 112. After a time T, an SET pulse causes "A" to switch to a high position, but "B" is still below the threshold of the standard inverter 114. "C" therefore remains in a high position. "B" gradually moves towards a low position, at a rate governed by the fall time ($T_F=T$) of the controllable inertial delay inverter 112. After at time less than T, "A" switches back to a low position, and "B" again moves towards a high position. When "B" rises above the threshold of the standard inverter 114, "C" switches to a low position. "C" therefore follows "A", after a delay of 3 T and with the SET pulse removed.

Thus, a free standing positive SET pulse of duration less than T is rejected, because the rise time $T_R$ of the first inverter 112 to the logic 1 threshold of the second inverter 114 is controlled to be T. Similarly, a free-standing negative SET pulse of duration less than T is also rejected, since the fall time $T_F$ of the first inverter 112 to the logic 0 threshold of the second inverter 114 is controlled to be T. If an SET pulse occurs at the worst case time at the end of the cycle (as shown in FIG. 6d), it is forced to be free standing (and thus rejected) by a setup time of T and a timing slack of 2 T. That is, in normal operation, the data is guaranteed to be settled to its final state at a time at least 3 T before the subsequent clock edge. If an SET pulse occurs earlier, it has sufficient time to settle out, even if it simply extends the data transition and is not free standing. If an SET pulse appears later, it does not have time to propagate.

Figure 7:
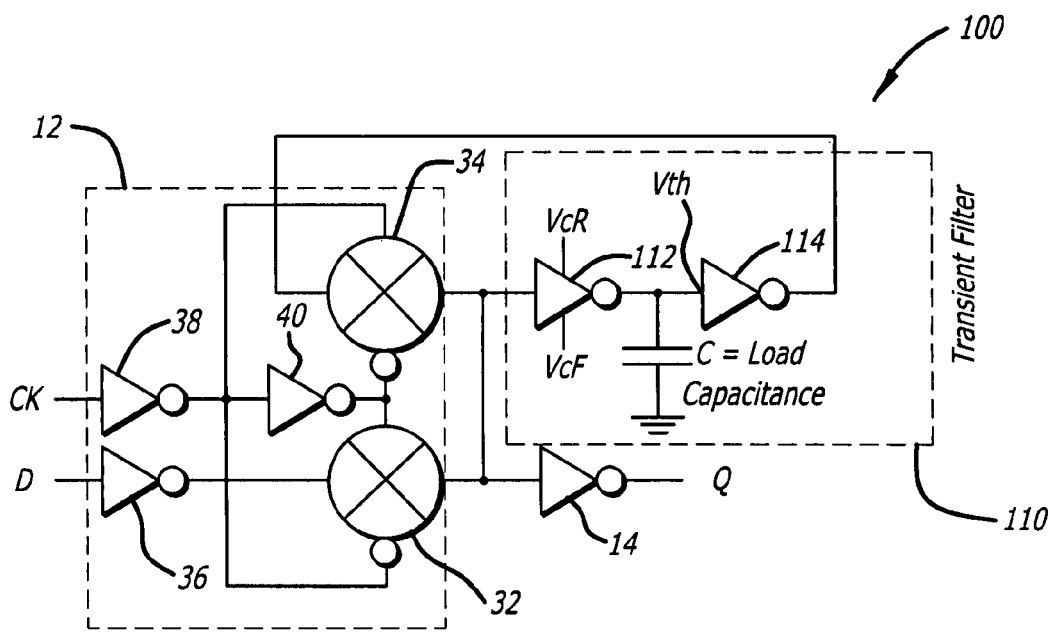
FIG. 7 is a schematic of an illustrative implementation of a transient-filtering latch designed in accordance with the present teachings.

FIG. 7 is a schematic of an illustrative implementation of a transient-filtering latch 100 designed in accordance with the present teachings. In the illustrative embodiment, the multiplexer 12 is implemented using two transmission gates 32 and 34. The input data D is passed through an input buffer inverter 36 and input to the first transmission gate 32. The output of the transient filter 110 is input to the second transmission gate 34. The clock signal is passed through an input buffer inverter 38 to generate an inverse clock signal, which is passed through another inverter 40 to recover the original clock signal. The clock and inverse clock signals are both coupled to the two transmission gates 32 and 34. The outputs of the transmission gates 32 and 34 are coupled together at the output of the multiplexer 12, which is input to an output buffer inverter 14. The output of the multiplexer 12 is also passed to the transient filter 110. The transient filter 110 includes a controllable inertial delay inverter 112 followed by a standard inverter 114. Control voltages VcR and VcF are input to the controllable inertial delay inverter 112 for controlling the rise and fall times thereof, respectively.

Figure 8:
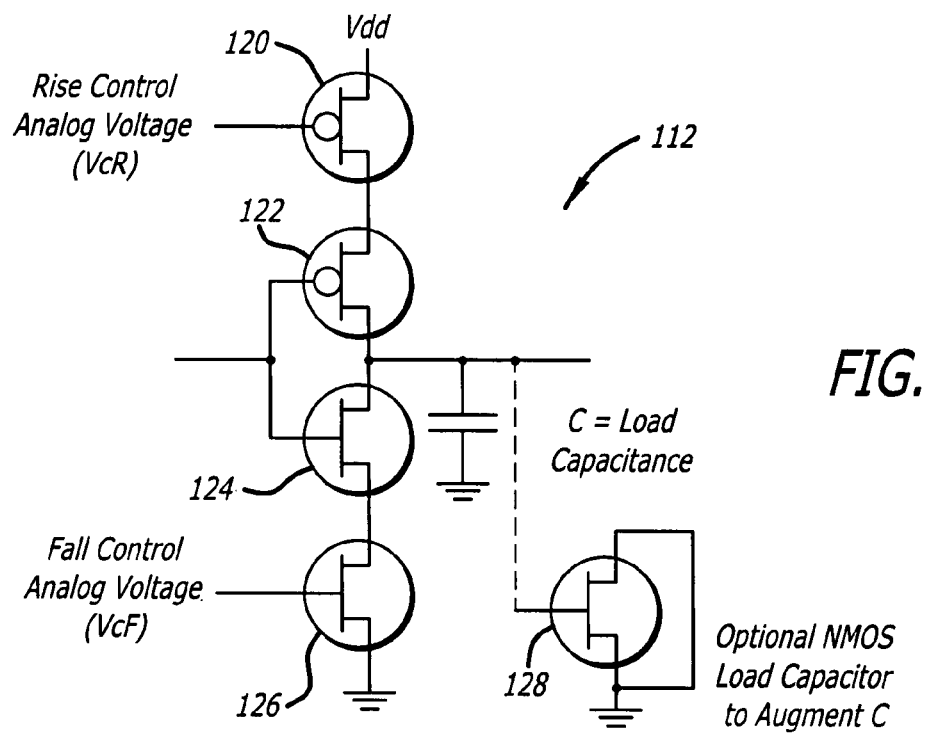
FIG. 8 is a simplified schematic of an illustrative controllable inertial delay inverter for use in a transient-filtering latch designed in accordance with the present teachings.

FIG. 8 is a simplified schematic of an illustrative controllable inertial delay inverter 112 for use in a transient-filtering latch 100 designed in accordance with the present teachings. The controllable inertial delay inverter 112 includes a first PMOS 120, a second PMOS 122, a first NMOS 124, and a second NMOS 126. The input to the inverter 112 is coupled to the gates of PMOS 122 and NMOS 124. The drains of PMOS 122 and NMOS 12 are coupled in common to the output of the inverter 112. The source of PMOS 122 is coupled to the drain of PMOS 120 and the source of NMOS 124 is coupled to the drain of NMOS 126. The source of PMOS 120 is coupled to a supply voltage Vdd, and the source of NMOS 126 is coupled to ground. The gate of PMOS 120 is coupled to the rising edge control voltage VcR, and the gate of NMOS 126 is coupled to the falling edge control voltage VcF. FIG. 8 also shows a load capacitance C coupled to the circuit output, and an optional NMOS 128 configured as a load capacitor to augment C.

The voltage slew rate of the controllable inertial delay inverter 112 is equal to I/C, where I is the transistor saturation current at $V_c$. The saturation current I is set by the control voltages VcR and VcF. The time to threshold is equal to the threshold voltage Vth divided by the slew rate and therefore equals C*Vth/I. In accordance with the present teachings, the control voltages VcR and VcF are controlled such that the time to threshold is equal to T.

Since the responsiveness of the P and N current limiting transistors may differ, the rise time to threshold $T_R$ and the fall time to threshold $T_F$ of the controllable inertial delay inverter 112 may differ. The rise time $T_R$ of the inverter 112 is controllable by VcR and the fall time $T_F$ is controlled by VcF. In a preferred embodiment, the rise time $T_R$ and fall time $T_F$ are both set to the same value T so that performance is symmetrical. An SET pulse can be either positive or negative, and the rejected pulse width should be the same (T).

Figure 9:
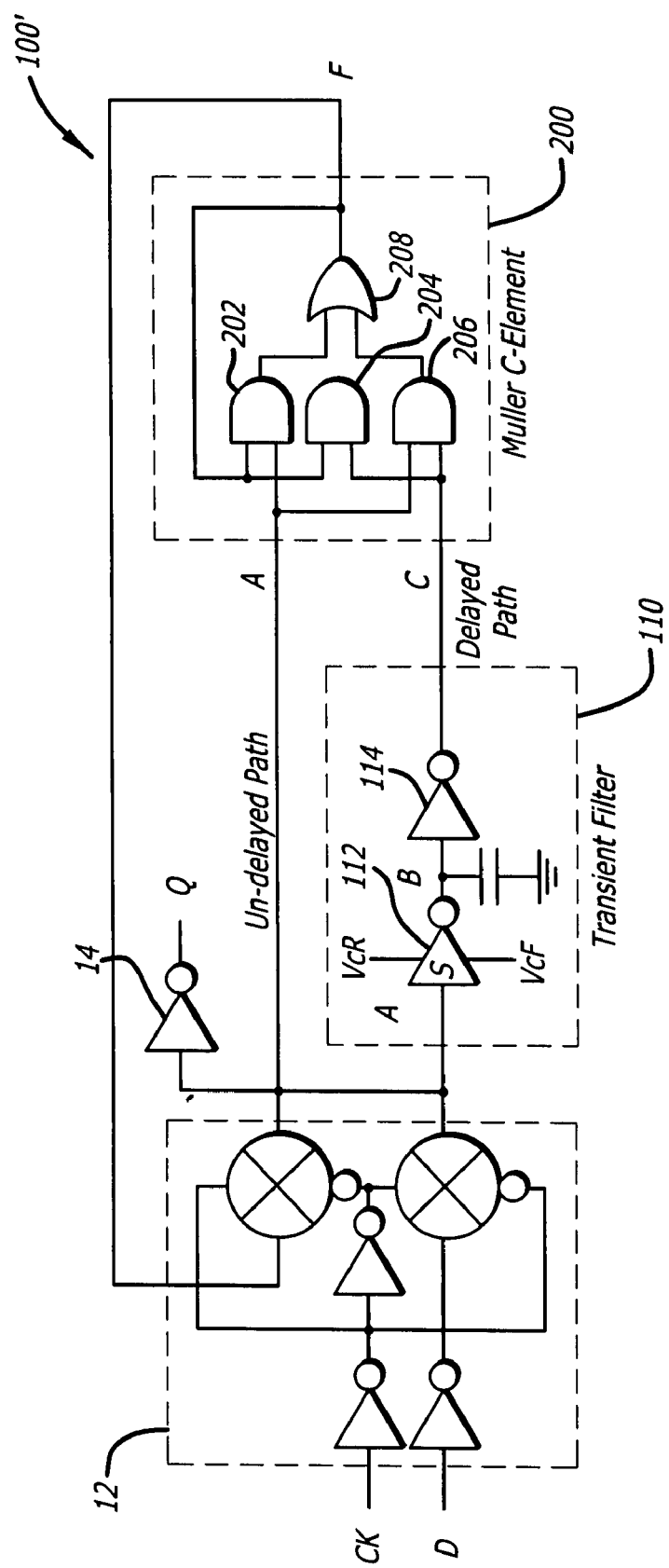
FIG. 9 is a simplified schematic of an alternative implementation of a transient-filtering latch designed in accordance with the present teachings that includes additional logic for filtering upsets at the output of the controllable inertial delay inverter.

FIG. 9 is a simplified schematic of an alternative implementation of a transient-filtering latch 100' designed in accordance with the present teachings. The transient filter 110 described above may be sensitive to impact by a radiation particle at the output of the controllable inertial delay inverter 112. Since its output impedance is controlled to be higher than the other logic elements (and its saturation current is less), a charge injected by a particle will take longer to be swept away. As a result, a particle that would cause an SET pulse less than T on any other logic element could cause a pulse greater than T if the event occurred at the output of the controllable inertial delay inverter 112. This would cause a single event upset at the affected latch. Thus, there is a residual SEU rate, depending on the probability of an SET at any controllable inertial delay inverter 112 in the device.

Figures 10A, 10B:
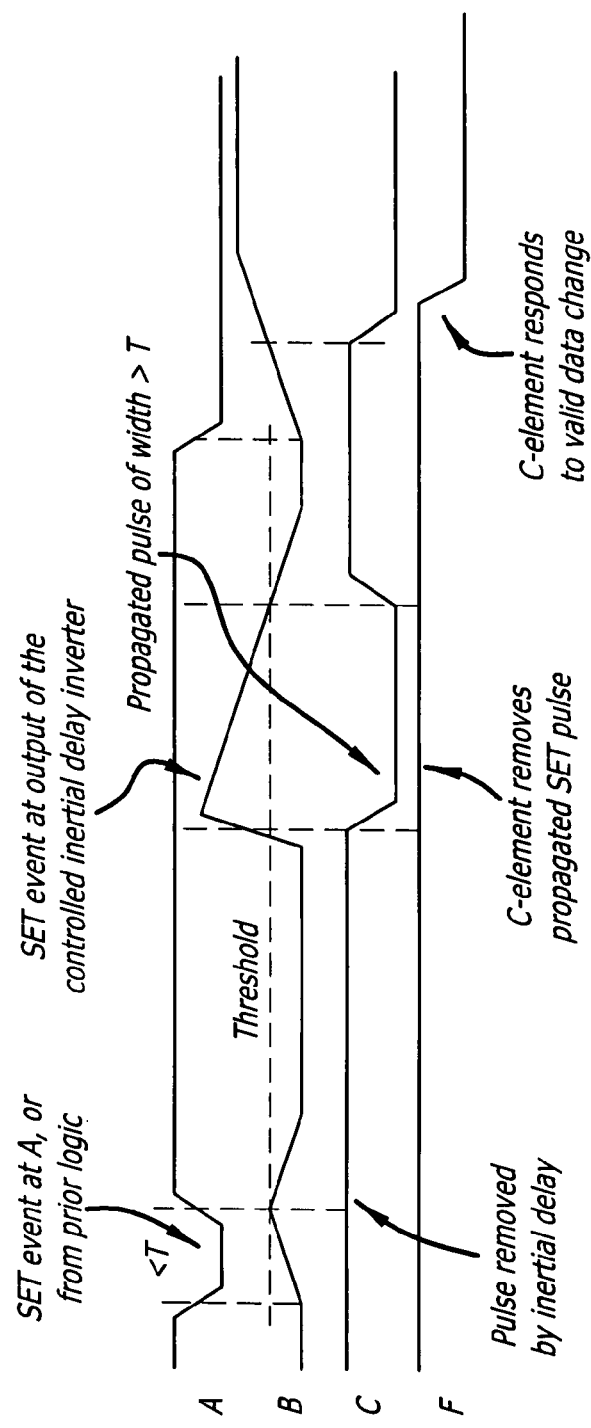
FIG. 10a is a truth table showing the outputs F of the C-element in the alternative latch of FIG. 9 for various inputs A and C.
FIG. 10b is a timing diagram illustrating the operation of the alternative transient-filtering latch of FIG. 9.

FIG. 9 shows an alternative transient-filtering latch 100' that includes additional logic 200 for filtering upsets at the output of the controllable inertial delay inverter 112. The latch 100' is identical to the latch 100 described in FIG. 7, except for the addition of a Muller C-element 200 in the holding loop. The C-element 200 has two input and one output. The first input (labeled "A") of the C-element 200 is coupled to the input to the transient filter 110, and the second input (labeled "C") of the C-element 200 is coupled to the output of the transient filter 110. Thus, the first input is the undelayed data output from the multiplexer 12, and the second input is the data output from the multiplexer 12 after being filtered and delayed by the transient filter 110. The output (labeled "F") of the C-element 200 changes states if and only if both inputs are the same, and of opposite state than the output. FIG. 10a is a truth table showing the output F of the C-element 200 for various inputs A and C.

Thus, if "A" and "C" are at zero, the output "F" is zero. If "A" is zero and

"C" is one, or if "A" is one and "C" is zero, then "F" does not change. If "A" is one and "C" is one, then "F" is one.

As shown in FIG. 9, the C-element 200 can be implemented using three AND gates 202, 204, and 206 and an OR gate 208. The two inputs of the first AND gate 202 are coupled to the input of the transient filter 110 and the output of the C-element 200. The two inputs of the second AND gate 204 are coupled to the output of the transient filter 110 and the output of the C-element 200. The two inputs of the third AND gate 206 are coupled to the input and output of the transient filter 110. The OR gate 208 receives the outputs from the three AND gates 202, 204, and 206, and provides the output of the C-element 200.

FIG. 10b is a timing diagram illustrating the operation of the alternative transient-filtering latch 100' of FIG. 9. "A" shows an illustrative input to the transient filter 110 (and the first input of the C-element 200) that includes an SET pulse with a width less than T. "B" shows the output of the controllable inertial delay inverter 112, which includes an SET event occurring with a propagated pulse width greater than T. "C" shows the output of the transient filter 110 (which is also input to the C-element 200), in which the SET pulse from A is removed but the SET pulse from B is not. "F" shows the output of the C-element 200. The C-element 200 causes the wide SET pulse at the transient filter output C to be rejected, since there is no corresponding SET pulse at the input A. In the case of a valid data change, the C-element 200 changes state appropriately, since both inputs change to the same state (after the time delay of the transient filter 110). Thus, all residual SEU can be eliminated by this circuit 100', at a cost of additional logic.

Figure 11:
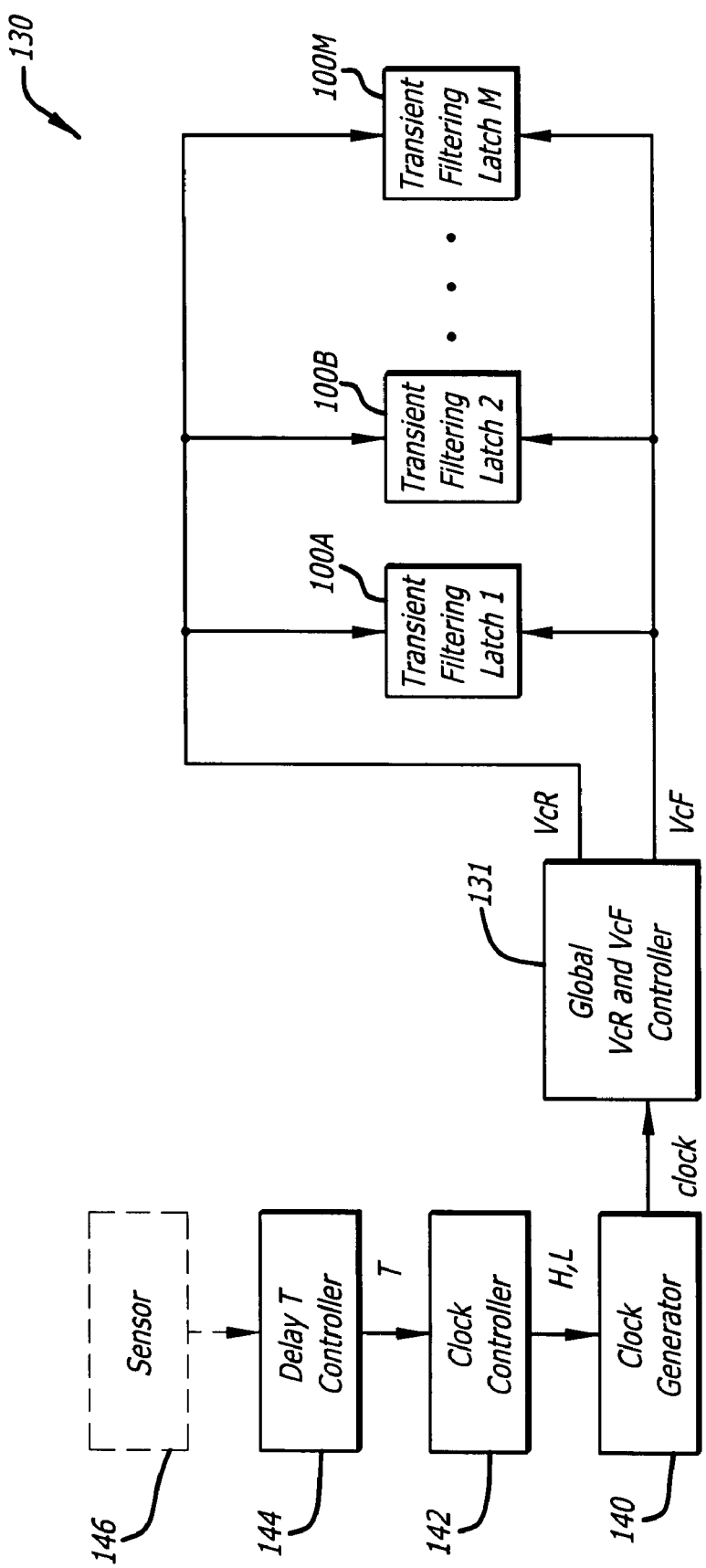
FIG. 11 is a system block diagram of a digital circuit using transient-filtering latches designed in accordance with an illustrative embodiment of the present teachings.

The teachings of the present invention also provide a novel method for generating the control voltages VcR and VcF to precisely control the rise and fall times of the controllable inertial delay inverters 112. FIG. 11 is an overall system block diagram of a digital circuit 130 designed in accordance with an illustrative embodiment of the present teachings. The digital circuit 130 includes a plurality of transient-filtering latches 100A-100M, each latch 100 having a transient filter 110 with a controllable inertial delay inverter 112 for suppressing transient pulses having a duration less than the inertial delay (including the rise time $T_R$ and fall time $T_F$) of the inverter 112, as described above.

The novel circuit design includes a global VcR and VcF controller 131 for precisely controlling the values of the rising edge delay $T_R$ and falling edge delay $T_F$ of the latches 100 to be equal to T (the longest anticipated duration of a transient pulse), independent of process or operating conditions. The VcR and VcF controller 131 generates a precise control voltage VcR, which is distributed to the controllable inertial delay inverters 112 of each latch 100 to control its rise time $T_R$. The VcR and VcF controller 131 also generates a precise control voltage VcF, which is distributed to the controllable inertial delay inverters 112 of each latch 100, to control its fall time $T_F$.

In the illustrative embodiment of FIG. 11, the VcR and VcF controller 131 generates the values of VcR and VcF based on the pulse width of a clock signal generated by a clock generator 140. A clock controller 142 provides the clock frequency and the clock pulse width (including a high pulse width H and a low pulse width L), which are adjusted depending on the desired value of T (as described below). The value of T is provided by a delay T controller 144. The value of T may be input by the user dependent on the anticipated duration of transient pulses, or it may be determined based on measurements from a sensor 146 adapted to measure environmental conditions.

Figure 12:
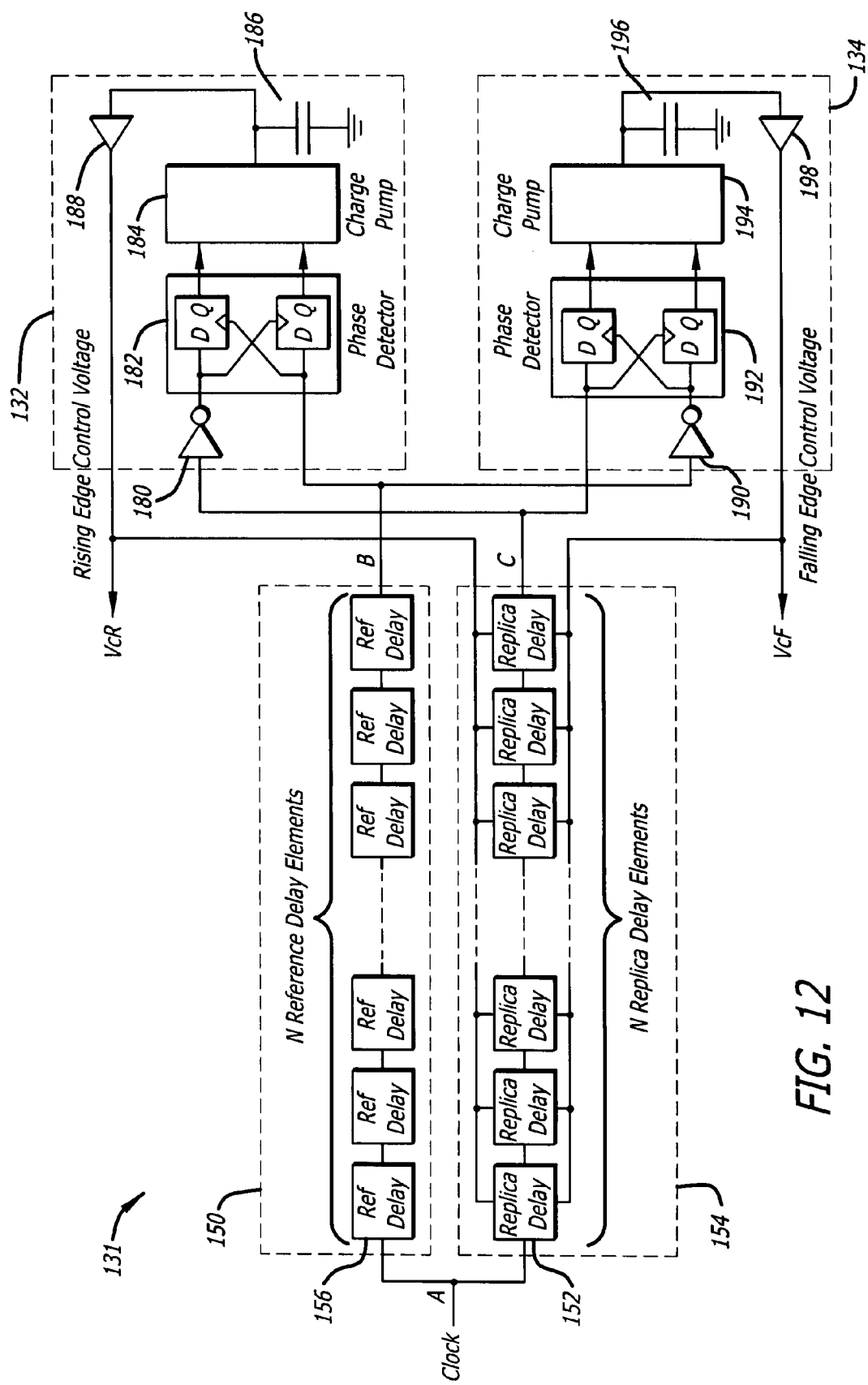
FIG. 12 is a simplified schematic of a controller for generating VcR and VcF designed in accordance with an illustrative embodiment of the present teachings.

FIG. 12 is a simplified schematic of a VcR and VcF controller 131 designed in accordance with an illustrative embodiment of the present teachings. The illustrative VcR and VcF controller 131 uses delay locked loops to generate precise control voltages VcR and VcF, which are adapted to control the rising edge delay $T_R$ and falling edge delay $T_F$, respectively, in the transient-filtering latches to be equal to T. The VcR and VcF controller 131 includes a reference delay chain 150, a replica delay chain 154, a VcR controller 132, and a VcF controller 134. The reference delay chain 150 is comprised of N reference delay elements 156 connected in series, and the replica delay chain 154 is comprised of N replica delay elements 152 connected in series.

Figure 13B:
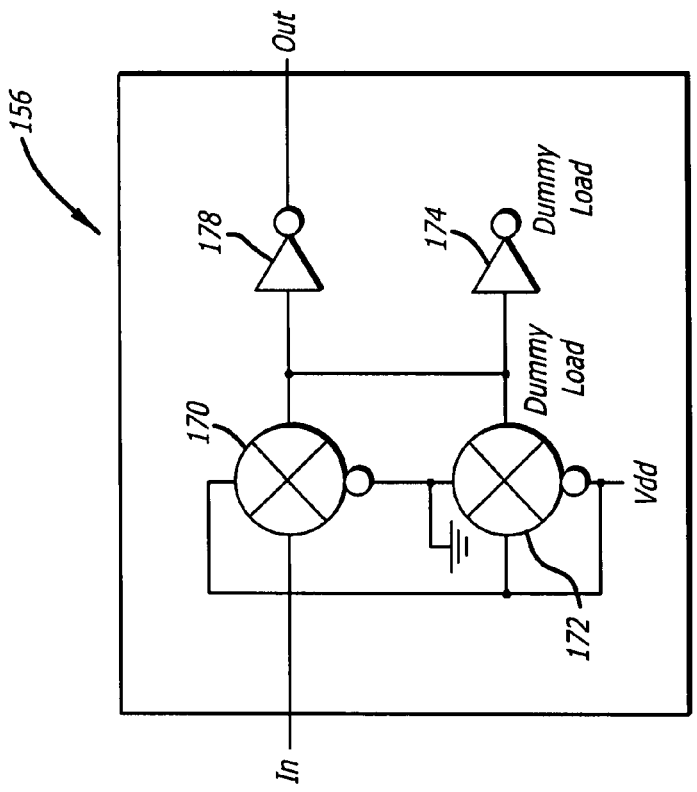
FIG. 13b is a simplified schematic of a reference delay element designed in accordance with an illustrative embodiment of the present teachings.
Figure 13A:
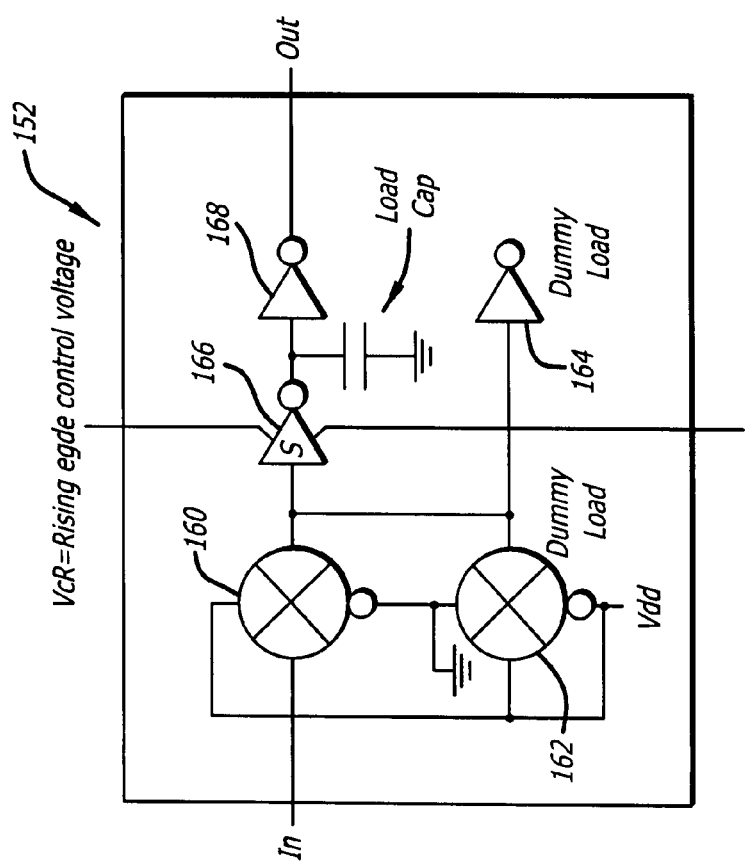
FIG. 13a is a simplified schematic of a replica delay element designed in accordance with an illustrative embodiment of the present teachings.

FIG. 13a is a schematic of an illustrative replica delay element 152 designed in accordance with the present teachings. Each replica delay elements 152 is adapted to provide a delay that is identical to the latch loop delay (the transit time through the transmission gates 32 and 34, controllable inertial delay inverter 112, and standard inverter 114, as shown in FIG. 7).

The replica delay element 152 includes two transmission gates 160 and 162. The input of the first transmission gate 160 is coupled to the input of the replica delay element 152. The input of the second transmission gate 162 is coupled to a supply voltage Vdd. The clock inputs of the transmission gates 160 and 162 are coupled to ground and Vdd. The clock inputs of the transmission gates 160 and 162 are coupled in common to a dummy load 164. The outputs of the transmission gates 160 and 162 are also coupled to the input of a controllable inertial delay inverter 166, which is adapted to receive the control voltage VcR for controlling the rise time of the inverter 166 and the control voltage VcF for controlling the fall time of the inverter 166. The output of the controllable inertial delay inverter 166 is coupled to a standard inverter 168. Thus, the replica delay element 152 is a replica of the feedback loop of the transient filtering latch 100 (see FIG. 7).

FIG. 13b is a schematic of an illustrative reference delay element 156 designed in accordance with the present teachings. Each reference delay element 156 is adapted to provide a delay that is identical to the latch loop delay minus the delay of the controllable inertial delay inverter.

The reference delay element 156 includes all of the components of the replica delay element 152 except for the controllable inertial delay element 166. Thus, the reference delay element 156 includes two transmission gates 170 and 172. The input of the first transmission gate 170 is coupled to the input of the reference delay element 156. The input of the second transmission gate 172 is coupled to the supply voltage Vdd. The clock inputs of the transmission gates 170 and 172 are coupled to ground and Vdd. The outputs of the transmission gates 170 and 172 are coupled in common to a dummy load 174. The outputs of the transmission gates 170 and 172 are also coupled to a standard inverter 178. Thus, the reference delay element 156 is a replica of the feedback loop of the transient-filtering latch 100 (see FIG. 7), but without the controllable inertial delay inverter.

Returning to FIG. 12, the VcR controller 132 and VcF controller 134 use the delay chains 150 and 154 to control the voltages VcR and VcF, respectively, which are fed back to the replica delay elements 152 of the replica delay chain 154, forming two delay locked loops.

A repetitive time reference pulse (i.e. a clock, which may or may not be the system clock) is input to the delay chains 150 and 154. The outputs of the delay chains 150 and 154 are both input to the VcR controller 132 and the VcF controller 134. The VcR controller 132 and VcF controller 134 use phase detector and loop filter circuits to adjust the control voltages VcR and VcF, respectively, until the delay through the replica delay chain 154 minus the delay through the reference chain 150 is equal to the clock pulse width.

In the illustrative embodiment, the VcR controller 132 includes an inverter 180, a phase detector 182, a charge pump 184, a capacitor 186, and an output buffer 188. The output of the replica chain 154 is passed through the inverter 180 and coupled to the first input of the phase detector 182. The output of the reference chain 150 is coupled to the second input of the phase detector 182. The outputs of the phase detector 182 are input to the charge pump 184, the output of which is coupled to the capacitor 186 and passed through the output buffer 188. The output of the output buffer 188 is the output of the VcR controller 132. This output is the rising edge control voltage VcR that is distributed to the replica delay elements 152 of the delay chain 154, and to all the transient-filtering latches 100 of the overall circuit 130 (see FIG. 11).

Similarly, the VcF controller 134 includes an inverter 190, a phase detector 192, a charge pump 194, a capacitor 196, and an output buffer 198. The output of the replica chain 154 is coupled to the first input of the phase detector 192. The output of the reference chain 150 is pass through the inverter 190 and coupled to the second input of the phase detector 192. The outputs of the phase detector 192 are input to the charge pump 194, the output of which is coupled to the capacitor 196 and passed through the output buffer 198. The output of the output buffer 198 is the output of the VcF controller 134. This output is the falling edge control voltage VcF that is distributed to the replica delay elements 152 of the delay chain 154, and to all the transient-filtering latches 100 of the overall circuit 130 (see FIG. 11).

In the VcR controller 132, the phase detector 182 compares the phase of the output of the reference delay chain 150 with the phase of the inverted output of the replica delay chain 154. If the rising edges of these two input are different, the phase detector 182 causes the charge pump 184 to adjust the control voltage VcR until the rising edges are aligned. Similarly, in the VcF controller 134, the phase detector 192 compares the phase of the output of the replica delay chain 154 with the phase of the inverted output of the reference delay chain 150. If the rising edges of these two inputs are different, the phase detector 192 causes the charge pump 194 to adjust the control voltage VcF until the rising edges are aligned.

As VcR is reduced from Vdd (minimum delay), the controlled falling edge delay provided by the replica delay element 152 increases (because the rising edge delay of the controllable inertial delay inverter 166 is delayed, and this is inverted to a delayed falling edge by the standard inverter 168). As VcF is increased from ground (minimum delay), the controlled rising edge delay provided by the replica delay element 152 increases (because the falling edge delay of the controllable inertial delay inverter 166 is delayed, and this is inverted to a delayed rising edge by the standard inverter 168).

Figure 14:
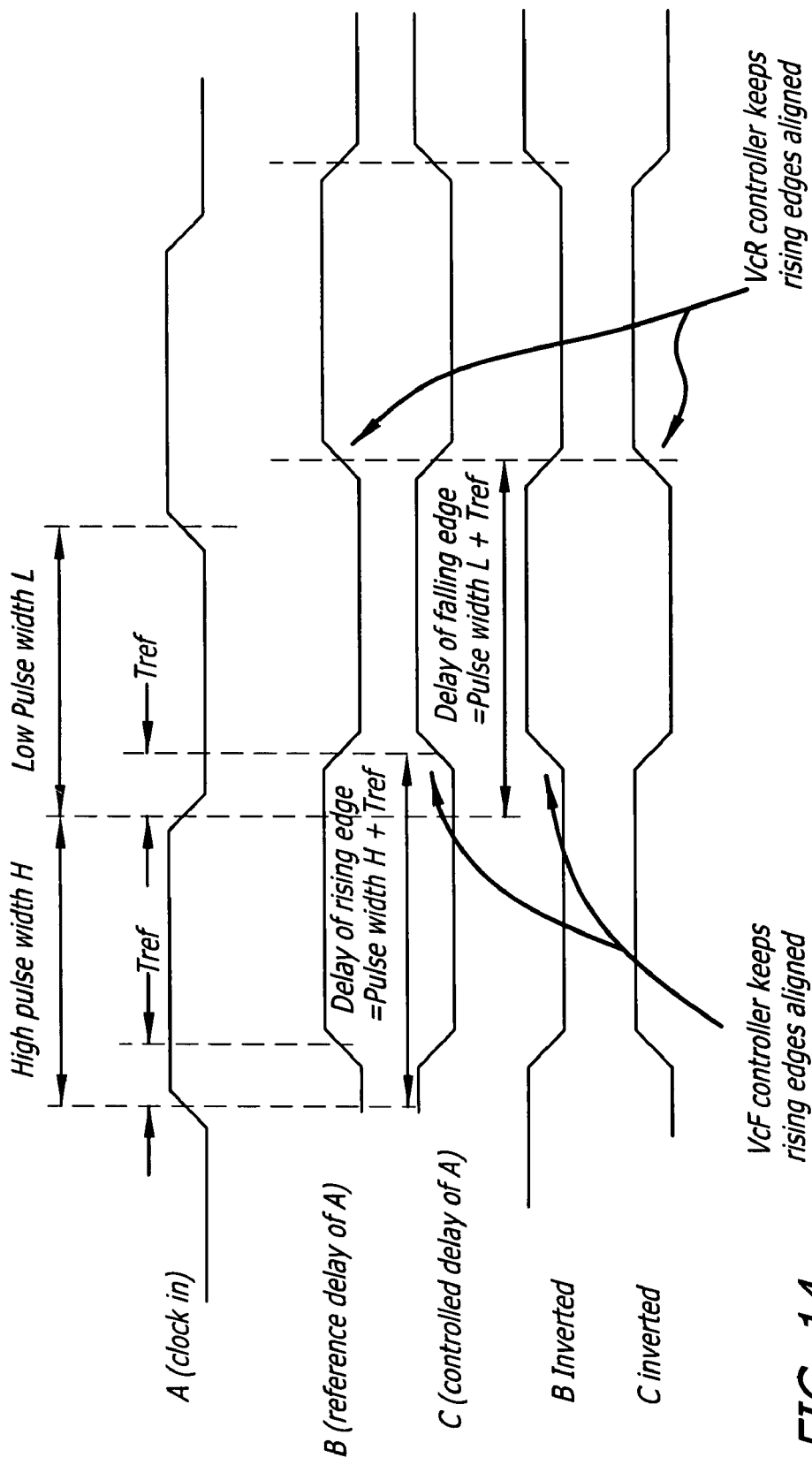
FIG. 14 is a timing diagram illustrating the operation of a VcR and VcF controller designed in accordance with an illustrative embodiment of the present teachings.

FIG. 14 is a timing diagram illustrating the operation of a VcR and VcF controller 131 designed in accordance with an illustrative embodiment of the present teachings. "A" shows an illustrative clock signal having a high pulse width H and low pulse width L (in this example, H is equal to L), which is input to the delay chains 150 and 154. "B" shows the resultant signal at the output of the reference delay chain 150, which is the clock signal delayed by a reference line delay $T_{ref}$ (the delay through the reference chain 150). "C" shows the resultant signal at the output of the replica delay chain 154, which is the clock signal delayed by a controlled delay $T_{con}$ (the delay through the replica chain 154). The diagram also shows the inverted "B" signal, which is the signal at the output of the inverter 190 that is compared with "C" by the VcF controller 134, and the inverted "C" signal, which is the signal at the output of the inverter 180 that is compared with "B" by the VcR controller 132.

The VcR controller 132 keeps the rising edges of "B" and inverted "C" aligned. The falling edge delay of the replica delay chain 154 is thus controlled to be equal to the low pulse width L of the clock plus the reference line delay $T_{ref}$. The delay $t_e$ of a single replica delay element 152 is therefore $t_e = (L + T_{ref})/N$. The delay of a single reference element 156 is $T_{ref}/N$, which is the delay $t_e$ of all the components in a replica element 152 minus the rising edge delay $T_R$ of the controlled inertial delay inverter 166. Thus, since $t_e = T_R + (T_{ref}/N) = (L + T_{ref})/N$, then $T_R = L/N$. The rising edge delay $T_R$ of the controllable inertial delay inverters (all of the controllable inverters controlled by VcR, including those in the latches 100 and the replica delay elements 152) can therefore be controlled by adjusting the low pulse width L of the clock. To set the rising edge delay $T_R$ to a given T, the longest anticipated duration of transients, the low pulse width L should be set to T multiplexed by N, the number of replica delay elements 152 in the controller 131.

Similarly, the VcF controller 134 keeps the rising edges of "C" and inverted "B" aligned. The rising edge delay of the replica delay chain 154 is thus controlled to be equal to the high pulse width H of the clock plus the reference line delay $T_{ref}$. The delay of a single replica delay element 152 is therefore $t_c = (H + T_{ref})/N$. The delay of a single reference element 156 is $T_{ref}/N$, which is the delay $t_e$ of all the components in a replica element 152 minus the falling edge delay $T_F$ of the controlled inertial delay inverter 166. Thus, since $t_e = T_F + (T_{ref}/N) = (H + T_{ref})/N$, then $T_F = H/N$. The falling edge delay $T_F$ of the controllable inertial delay inverters (all of the controllable inverters controlled by VcF, including those in the latches 100 and the replica delay elements 152) can therefore be controlled by adjusting the high pulse width H of the clock. To set the rising edge delay $T_F$ to a given T, the longest anticipated duration of transients, the high pulse width H should be set to T multiplied by N, the number of replica delay elements 152 in the controller 131.

In the illustrative embodiment of FIG. 11, the latches 100 can therefore be configured to filter out pulses having a width less than T by setting the clock pulse width (H=L) to T multiplied by N, the number of replica delay elements 152 in the controller 131.

Thus, the teachings of the present invention include a novel transient-filtering latch 100 that removes pulses having a width less than a value T and delays signals by a delay equal to T. The present teachings also include a novel circuit 131 for precisely controlling the delay T in the transient-filtering latch 100 independent of variations in temperature, voltage, process, or aging. This allow T to b e adjustable for different applications and environmental conditions (increasing T gives greater SEU immunity, but may require a slower clock rate). A single device can therefore b used on different applications, with different exposures or immunity requirements. If desired, adjustments for SEU immunity can be made in real time (for example, immunity can be temporarily increased during a solar flare event).

The novel transient-filtering latch 100 of the present teachings provides reduced single event upset, yet increases the size of a latch by only two transistors (an increase of only about 12%). This is significantly improved over the prior art. The longer clock period (by 3 T) can be overcome by the accurately controlled delay in the controllable inertial delay inverter. The delay T need not be set greater than required for SEU immunity to compensate for process and operating variations.

In the above description, the transient filter 110 is adapted to filter pulses having a width less than a maximum pulse width T using a single (first) inverter 112 having a controllable inertial delay that is set to the maximum transient pulse width T. Other configurations can also be used without departing from the scope of the present teachings. For example, the transient filter 110 can also be adapted to filter pulses having a width less than a maximum pulse width T if both the first inverter 112 and second inverter 114 are controllable inertial delay inverters having a controllable inertial delay that is set to T/2. In this case, the replica delay elements 152 in the global controller 131 are also set to T/2, such that the delay in each replica element is equal to T/2.

Thus, the present invention has been described herein with reference to a particular embodiment for a particular application. Those having ordinary skill in the art and access to the present teachings will recognize additional modifications, applications and embodiments within the scope thereof. For example, while the transient filter of the present invention was described with reference to use in a latch for SET and SEU immunity the transient filter may also be used in other applications to reject pulses having a width less than some predetermined amount. The transient filter may also be used as a controllable delay element, using the delay control techniques described above.

It is therefore intended by the appended claims to cover any and all such applications, modifications and embodiments within the scope of the present invention.

Accordingly,

What is claimed is:

1. A transient filter comprising:
   a first logic element having a controllable inertial delay;
   a second logic element coupled to an output of said first logic element; and
   a first controller configured to generate a control voltage VcR such that a rise time of said first logic element to a logic 1 threshold of said second logic element is controlled to be equal to a value T,
   wherein said first controller includes a phase detector and a loop filter circuit configured to receive an inverted output from a first delay chain and an output from a second delay chain, and in accordance therewith generate said control voltage VcR, and
   wherein said transient filter is configured to reject pulses having a width less than T.

2. The invention of claim 1 wherein said first logic element includes means for controlling said inertial delay such that a time to a threshold of said second logic element is equal to T.

3. The invention of claim 1 wherein said first logic element includes first means for controlling a rise time of said first logic element to a logic 1 threshold of said second logic element such that said rise time is equal to T.

4. The invention of claim 3 wherein said first logic element further includes second means for controlling a fall time of said first logic element to a logic 0 threshold of said second logic element such that said fall time is equal to T.

5. The invention of claim 4 wherein said second means includes a circuit adapted to receive a control voltage VcF and in accordance therewith control a fall time of said first logic element.

6. The invention of claim 3 wherein said first means includes a circuit adapted to receive the control voltage VcR and in accordance therewith control a rise time of said first logic element.

7. The invention of claim 1 wherein said first logic element is a controllable inertial delay inverter.

8. The invention of claim 7 wherein said second logic element is an inverter.

9. The invention of claim 1 wherein said second logic element also has a controllable inertial delay.

10. The invention of claim 9 wherein said first and second logic elements are controlled to have an inertial delay equal to T/2.

11. The invention of claim 1 wherein said transient filter further includes filtering means for filtering an upset occurring at an output of said first logic element.

12. The invention of claim 11 wherein said filtering means includes a C-element having a first input coupled to an input of said first logic element and a second input coupled to an output of said second logic element.

13. The invention of claim 1, wherein T is set to a longest anticipated duration of a single event transient.

14. The invention of claim 1, further comprising a second controller configured to generate a control voltage VcF such that a fall time of said first logic element to a logic 0 threshold of said second logic element is controlled to be equal to T.

15. The invention of claim 14, wherein said second controller includes a phase detector and a loop filter circuit configured to receive an output from a first delay chain and an inverted output from a second delay chain, and in accordance therewith generate said control voltage VcF.

16. A system comprising:
   filtering means for rejecting transient pulses having a width less than T, said filtering means including a first logic element adapted to receive first and second control voltages and in accordance therewith control a rise time and a fall time, respectively, of said first logic element, and a second logic element coupled to an output of said first logic element;
   first means for generating said first control voltage: and
   second means for generating said second control voltage;
   wherein said first means is configured to generate a control voltage VcR such that a rise time of said first logic element to a logic 1 threshold of said second logic element is controlled to be equal to T, and
   wherein said first means comprises a phase detector and a loop filter circuit configured to receive an inverted output from a first delay chain and an output from a second delay chain, and in accordance therewith generate said control voltage VcR.

17. The invention of claim 16 wherein said second means is adapted to generate a second control voltage such that a fall time of said first logic element to a logic 0 threshold of said second logic element is controlled to be equal to T.

18. A transient filter comprising:
    a first logic element having a controllable inertial delay;
    a second logic element coupled to an output of said first logic element; and
    a second controller configured to generate a control voltage VcF such that a fall time of said first logic element to a logic 0 threshold of said second logic element is controlled to be equal to a value T;
    wherein said second controller includes a phase detector and a loop filter circuit configured to receive an output from a first delay chain and an inverted output from a second delay chain, and in accordance therewith generate said control voltage VcF, and
    wherein said transient filter is configured to reject pulses having a width less than T.

* * * * *